United States Patent [19]

Breit et al.

[11] Patent Number: 5,138,114
[45] Date of Patent: Aug. 11, 1992

[54] HYBRID/MICROWAVE ENCLOSURES AND METHOD OF MAKING SAME

[75] Inventors: Henry F. Breit, Attleboro, Mass.; Premkumar R. Hingorany, Louisville, Colo.; John A. Haug, North Attleboro, Mass.

[73] Assignee: Texas Instruments Incorporated, Dallas, Tex.

[21] Appl. No.: 413,346

[22] Filed: Sep. 27, 1990

[51] Int. Cl.⁵ .................. H01L 23/02; B23K 31/02
[52] U.S. Cl. ................... 174/52.4; 357/74; 29/592.1; 228/120; 228/178; 228/179
[58] Field of Search .......... 228/178, 179, 120, 193; 174/52.1, 52.2, 52.3, 52.4; 357/72, 74, 75; 29/592.1

[56] References Cited

U.S. PATENT DOCUMENTS

| | | |
|---|---|---|
| 3,813,758 | 6/1974 | Araki ............................ 29/470.1 |
| 3,823,299 | 7/1974 | Metcalfe et al. ................ 219/83 |
| 4,227,036 | 10/1980 | Fitzgerald .................... 174/16.3 |
| 4,266,090 | 5/1981 | Scherer ......................... 174/52.4 |
| 4,506,108 | 3/1985 | Kersch et al. ................ 174/52.4 |
| 4,614,836 | 9/1986 | Carpenter et al. ........... 174/52.4 |
| 4,649,229 | 3/1987 | Scherer et al. ............... 174/52.4 |
| 5,001,299 | 3/1991 | Hingorany .................... 174/52.4 |

Primary Examiner—Leo P. Picard
Assistant Examiner—Bot Ledynh
Attorney, Agent, or Firm—Russell E. Baumann; René E. Grossman; RenéE. Grossman

[57] ABSTRACT

A method of forming enclosures for microwave and hybrid devices and the enclosure itself wherein the metals to be joined are thin (i.e., less than 40 mils thick) and/or thick (up to several inches) and wherein metallurgical hermetic bonds are provided between adjacent metals which are generally difficult to bond to each other and may be bonded by a select number of bonding processes.

16 Claims, 1 Drawing Sheet

HYBRID/MICROWAVE ENCLOSURES AND METHOD OF MAKING SAME

BACKGROUND OF THE INVENTION

1. Field of the Invention

This invention relates to enclosures for microwave and hybrid devices and to methods of making same.

2. Brief Description of the Prior Art

High performance hybrid/microwave enclosures are generally fabricated by brazing two or more metals together to obtain the combined properties and/or advantages available by the use of the two or more metals. Metals to be brazed are generally more than 40 mils thick in order to withstand the brazing operation and afford adequate strength. For example, a base fabricated from relatively expensive nickel/molybdenum is generally brazed to the less expensive body of the enclosure to provide an economic advantage and often, in addition, an improvement in the desired physical properties. In addition, braze assembly tooling is required, this providing for additional expense. Furthermore, many desirable combinations of metals, such as stainless steel and aluminum, cannot be brazed to each other without presenting undesirable problems, such as, for example, undesired porosity. It is required to clad different metals ranging from about 0.180 inch to about 3 inches to another metal ranging from about 0.015 inch to about 3 inches to each other with bonding therebetween being metallurgical with the provision of an hermetic bond between the metals.

SUMMARY OF THE INVENTION

In accordance with the present invention, there is provided a method of forming enclosures for microwave and hybrid devices and the enclosure itself wherein the metals to be joined are thin (i.e., less than 40 mils thick) and/or thick (up to several inches) and wherein metallurgical hermetic bonds are provided between adjacent metals which are generally difficult to bond to each other. As stated above, the prior art involves fabrication by brazing of individual components or assemblies from which individual components are machined, resulting in a braze joint rather than a metallurgical bond as indicated by the presence of a lower melting point metal layer.

The metallurgical bond is accomplished by a number of bonding techniques for thick clad systems such as diffusion bonding, friction welding, hot roll bonding, explosive bonding, etc.

Briefly, the preferred method of bonding adjacent metals to each other is by explosive bonding because of process versatility, low capital investment, hermetic nature of the bond interface, ability to bond a variety of metals of differing tempers and compositions, etc. Examples of explosive bonding are shown in the patents of Dybwad U.S. Pat. No. 4,008,117, Hardwick U.S. Pat. No. 4,333,597 and Hanson U.S. Pat. No. 3,761,004. Layers of two or more different metals to be bonded together are disposed over and spaced from each other. A shock wave provided by the explosion passes along the interface of the layers to be bonded, forcing the spacer out from between the layers ahead of the shock wave, causing the adjacent layers to contact each other and causing a thin surface portion of each of the contacting adjacent layers to metallurgically comingle with each other and weld together to form the metallurgical bond.

A common technique is to place a third layer of a more easily bondable material such as a layer of low alloy or unalloyed aluminum or silver between each of the materials to be bonded. The layer can be bonded prior to or during the explosive bonding process. The bond formed is hermetic and the characteristics of each component are not altered. The technique is commonly used to join a variety of metals, metal matrix and high performance metal alloys.

The package is formed by providing a bar comprised of two or more layers of metal which are metallurgically bonded together and then machining out at least a part of one of the layers, leaving side walls with a hollow region therebetween and a bottom metallurgically bonded to at least the side walls to provide a package having side walls of at least one metal and a bottom of the same metal or a second metal. Other geometric variations are possible such as having a layer of metal on one side or both sides of the package as opposed to layers on the top and bottom. In essence, the packages already discussed are rotated ninety degrees. Other variations of packages formed by machining of a bar formed of two or more metallurgically bonded metal layer are readily apparent. The layers need not be of the same thickness with variations in the thickness of any layer being contemplated. Also, there is essentially no restriction on the thickness of the layers to be metallurgically bonded. After appropriate microwave and/or hybrid devices have been affixed within the package to the side walls and/or bottom thereof, the package is hermetically sealed by hermetically joining a cover to upper surfaces of the side walls, preferably but not necessarily of the same material as the side walls. In some instances, the lid can be of such a thickness as to serve the dual purpose of accommodating power feed throughs while serving as a lid.

While any metals capable of being explosively bonded together can be used in accordance with the present invention and provide a metallurgical bond therebetween, preferred combinations are copper/molybdenum wherein the side walls are copper and the base is molybdenum, a copper/molybdenum package having a layer of nickel clad to the molybdenum to facilitate initial bonding, Kovar/copper wherein the side walls are Kovar and the base is copper and T6 aluminum/stainless steel wherein the stainless steel is soft to provide good weldability and the aluminum is hard to provide good machinability.

DESCRIPTION OF THE PREFERRED EMBODIMENTS

Figure 1:
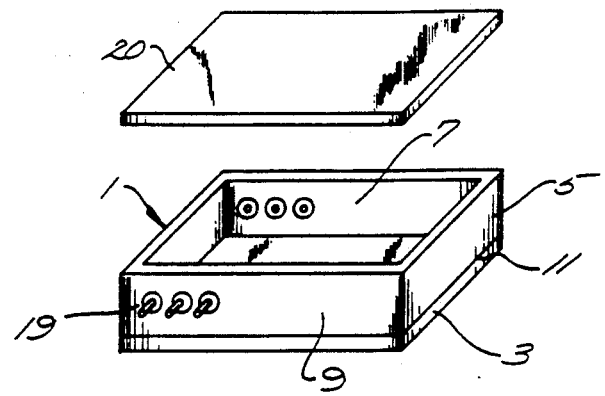
FIG. 1 is a perspective view of a package for microwave and/or hybrid devices in accordance with first and second embodiments of the present invention.

Referring first to FIG. 1, there is shown a package 1 for microwave and/or hybrid devices in accordance with the present invention. The package includes a thin base layer of molybdenum 3 onto which is bonded a thick layer of copper 5 having a hollowed out interior section 7 forming side walls 9 in which the microwave and/or hybrid assemblies are mounted. The hollowed out interior section 7 and side walls 9 can extend down to the layer of molybdenum 3 to provide a molybdenum base or be provided with a thin layer of copper 5 over the molybdenum to form the package base. The package is completed by providing terminals 19 extending through the walls and/or bottom which are insulated therefrom and hermetic by using, for example, a glass to metal seal having substantially the same coefficient of thermal expansion as the wall or bottom through which it extends (brazed eyelets of material such as Kovar may be required for certain assemblies) as well as a top or cover (not shown) of a metal which is hermetically sealed to the side walls. The top has a coefficient of thermal expansion substantially the same as that of the side walls and is preferably, but not necessarily, of the same material as the side walls.

As a second embodiment, as shown in FIG. 1, the molybdenum base can have a cladding 11 of nickel on the top and bottom surfaces thereof to provide better bondability.

Figure 2A:
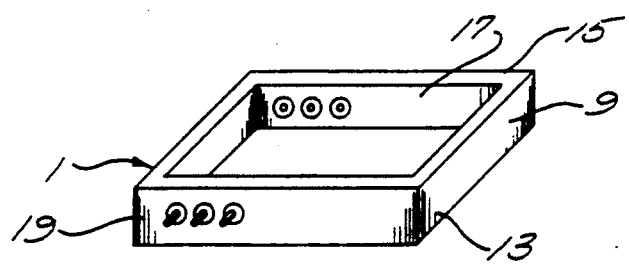
FIGS. 2a and 2b are perspective views in accordance with third and fourth embodiments of the present invention.
Figure 2B:
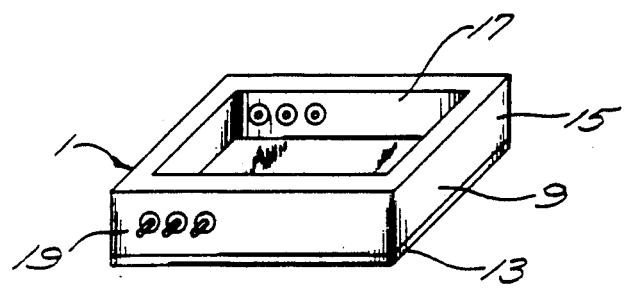

Referring now to FIGS. 2a and 2b, there is shown in FIG. 2a a third embodiment of the invention wherein the package is the same as that of FIG. 1 except that the bottom layer 13 is thick add is of copper and the top layer 15 is thin and is of Kovar. A hollowed out region 17 extends through the Kovar layer 15 and into the copper layer 13. Otherwise, the description of the first embodiment above is the same as that for FIG. 1.

In the fourth embodiment FIG. 2b the layers are the same as in FIG. 2a except that the Kovar layer is thick and the copper layer is thin. In addition, the hollowed out region 17 can extend up to the surface of the copper layer 13 and need not extend thereinto.

It should be understood that packages as shown in FIGS. 1 and 2 can be altered to include three or more layers of the same or different metals to provide desired physical properties, the requirement being that adjacent layers be secured together by a metallurgical bond which is hermetic.

The package of FIG. 1 is formed by placing a layer of copper and a layer of molybdenum next to each other and spaced with a thin spacer.

The packages described above are fabricated by initially placing a thin spacer therebetween and then providing a shock wave such as that produced by standard prior art explosive bonding. The result is that the shock wave travels between the two layers and forces the spacers to travel ahead of the shock wave. Meanwhile, as the spacers are removed, the layers come into intimate contact with each other and the surface particles thereof intermingle due to the shock wave then present to provide a metallurgical bond therebetween. This bond is also hermetic. The result is a bar having two distinct layers metallurgically bonded together with an hermetic bond.

The bar is then cut up into lengths having the dimensions of the final package to be fabricated and a portion of one of the layers (the copper layer in FIG. 1) is hollowed out by machining to form a cavity wherein the microwave and/or hybrid devices or circuitry will be affixed. In addition, terminals 19 are formed in the side walls by drilling out apertures therein and placing the terminals through the apertures. An appropriate sealant secures the terminals in the apertures and insulated from the side walls, the sealant preferably having the same coefficient of thermal expansion as the side walls. After the microwave and/or hybrid devices or circuits have been secured within the cavity, a top or cover 20 is then attached to the side walls by laser welding, tungsten inert gas (TIG) welding, etc. to provide a hermetic seal therewith and complete the package.

Alternatively, prior to cutting up the bar as described above, plural spaced cavities are formed by machining and the bar is then cut up into lengths having the dimensions of the final package to be fabricated. The individual machined lengths then proceed through the same fabrication process steps as described above to provide the final package.

The embodiments of FIGS. 2a and 2b can be formed in the same manner is described above with respect to FIG. 1.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

We claim:

1. A package for microwave and hybrid devices comprising:
   (a) a first metallic layer;
   (b) a second metallic layer metallurgically bonded to one side of said first layer forming an hermetic seal to said one side of said first layer to provide a plural layer bar;
   (c) the bar having a cavity extending from an opposite side of said first metallic layer through said hermetic seal into said second metallic layer to receive one of the devices therein; and
   (d) an electrical terminal extending through at least one of said first and second metallic layers and electrically insulated therefrom, the terminal extending into the cavity to be coupled to a device received therein, said first layer being copper and said second layer being molybdenum.

2. A package as set forth in claim 1, further including at least one device of a group consisting of microwave and hybrid devices secured within said cavity and coupled to said terminal.

3. A package as set forth in claim 2, further including a cover secured to said first layer and forming a hermetic seal therewith to provide a hermetically sealed cavity.

4. A package as set forth in claim 1, further including a third metallic layer bonded to said second metallic layer.

5. A package as set forth in claim 4 wherein said third layer is metallurgically bonded to said second layer.

6. A package as set forth in claim 3 wherein said cover has substantially the same coefficient of thermal expansion as said first layer.

7. A method of fabricating a package for microwave and hybrid devices comprising the steps of:
   (a) providing a first layer of copper;
   (b) providing a second layer of molybdenum;
   (c) metallurgically bonding said second metallic layer to one side of said first layer forming an hermetic seal therewith;
   (d) forming a cavity in an opposite side of said first metallic layer extending through said hermetic seal into said second metallic layer; and
   (e) securing an electrical terminal in at least one of said first and second metallic layers extending therethrough and electrically insulated from extending into said cavity to be coupled to a device received therein.

8. A method as set forth in claim 7, further including the step of securing a microwave hydrid device within said cavity and coupled to said terminal.

9. A method as set forth in claim 7, further including providing a cover; securing said cover to said first layer and forming an hermetic seal therewith to provide a hermetically sealed cavity.

10. A package for microwave and hydrid devices comprising:
    (a) a first copper layer; and
    (b) a second molybdenum layer metallurgically bonded to one side of said first layer forming an hermetic seal to said one side of said first layer to provide a plural layer bar;
    (c) the bar having a cavity extending from an opposite side of said first metallic layer through said hermetic seal into said second metallic layer to receive one of said devices within the cavity.

11. A package as set forth in claim 10 wherein the second metallic layer is explosively bonded to said one side of said first layer forming said hermetic seal.

12. A package for microwave and hybrid devices comprising:
    (a) a first metallic layer; and
    (b) a second metallic layer explosively bonded to one side of said first layer forming an hermetic seal to said one side of said first layer to provide a plural layer bar;
    (c) the bar having a cavity extending from an opposite side of said first metallic layer through said hermetic seal into said second metallic layer to receive one of said devices within the cavity, the first metallic layer being aluminum and the second metallic layer being stainless steel.

13. A package for microwave and hybrid devices comprising:
    (a) a first copper layer; and
    (b) a molybdenum second and third metallic layer, the third metallic layer disposed between and metallurgically bonded to said second metallic layer and to one side of said first layer forming an hermetic seal to provide a plural layer bar;
    (c) the bar having a cavity extending from an opposite side of said first copper layer through said hermetic seal and said third metallic layer to said second molybdenum layer to receive one of said devices within the cavity.

14. A method of fabricating a package for microwave and hybrid devices comprising the steps of:
    (a) providing a first metallic layer of copper;
    (b) providing a second metallic layer of molybdenum;
    (c) metallurgically bonding said second metallic layer to one side of said first layer forming an hermetic seal therewith; and
    (d) forming a cavity in an opposite side of said first metallic layer extending through said hermetic seal into said second metallic layer.

15. A method according to claim 14 wherein the second metallic layer is explosively bonded to said one side of said first layer forming said hermetic seal.

16. A method of fabricating a package for microwave and hybrid devices comprises the steps of:
    (a) providing a first metallic layer of aluminum;
    (b) providing a second metallic layer of stainless steel, and a third metallic layer disposed between and metallurgically bonded to said second layer and to one side of said first metallic layer forming an hermetic seal; and
    (c) forming a cavity in an opposite side of said first metallic layer extending through said hermetic seal with said second metallic layer.

* * * * *

UNITED STATES PATENT AND TRADEMARK OFFICE
CERTIFICATE OF CORRECTION

PATENT NO. : 5,138,114
DATED : August 11, 1992
INVENTOR(S) : Henry F. Breit et al.

It is certified that error appears in the above-identified patent and that said Letters Patent is hereby corrected as shown below:

Title page,
At [75], 3rd line after Louisville, Colo.;, delete
- John A. Haug, North Attleboro, Mass. -

Signed and Sealed this

Ninth Day of May, 1995

BRUCE LEHMAN

Attest:

Attesting Officer

Commissioner of Patents and Trademarks